United States Patent
Aparicio et al.

(10) Patent No.: US 12,253,968 B2
(45) Date of Patent: Mar. 18, 2025

(54) SERIAL BUS PROTOCOL

(71) Applicant: STMicroelectronics (Research & Development) Limited, Marlow (GB)

(72) Inventors: Sergio Miguez Aparicio, Majadahonda (ES); Benjamin Thomas Sarachi, Edinburgh (GB)

(73) Assignee: STMicroelectronics (Research & Development) Limited, Buckinghamshire (GB)

( * ) Notice: Subject to any disclaimer, the term of this patent is extended or adjusted under 35 U.S.C. 154(b) by 110 days.

(21) Appl. No.: 18/063,436

(22) Filed: Dec. 8, 2022

(65) Prior Publication Data

US 2023/0195679 A1    Jun. 22, 2023

(30) Foreign Application Priority Data

Dec. 16, 2021  (EP) ..................................... 21306804
May 20, 2022  (EP) ..................................... 22305752

(51) Int. Cl.
*G06F 13/42*    (2006.01)
*G06F 13/20*    (2006.01)

(52) U.S. Cl.
CPC .......... *G06F 13/4291* (2013.01); *G06F 13/20* (2013.01)

(58) Field of Classification Search
CPC .................................................. G06F 13/4291
See application file for complete search history.

(56) References Cited

U.S. PATENT DOCUMENTS

| | | | |
|---|---|---|---|
| 7,606,955 B1 | 10/2009 | Falik et al. | |
| 10,670,456 B2 | 6/2020 | Raynor et al. | |
| 2004/0059396 A1 | 3/2004 | Reinke et al. | |
| 2011/0087812 A1* | 4/2011 | Marten | G06F 13/4291 |
| | | | 710/105 |
| 2012/0144078 A1 | 6/2012 | Poulsen | |
| 2014/0241414 A1 | 8/2014 | Reidl et al. | |
| 2016/0371157 A1 | 12/2016 | Mishra et al. | |
| 2018/0329856 A1 | 11/2018 | Mishra et al. | |

FOREIGN PATENT DOCUMENTS

| | | |
|---|---|---|
| WO | 2013000916 A1 | 1/2013 |
| WO | 2017070377 A1 | 4/2017 |

OTHER PUBLICATIONS

Mikhaylov, K., et al., "Evaluation of Power Efficiency for Digital Serial Interfaces of Microcontrollers", IEEE 5th International Conference on New Technologies, Mobility and Security (NTMS), May 7-10, 2012, 5 pages.

* cited by examiner

Primary Examiner — Glenn A. Auve
(74) Attorney, Agent, or Firm — Slater Matsil, LLP

(57) ABSTRACT

In accordance with an embodiment, a system includes: a primary device configured to be connected to at least one secondary device via serial bus having a data wire and a clock wire. The primary device is configured to: provide a clock signal on the clock wire; and transmit a frame comprising control bits on the serial bus, wherein a number of control bits transmitted on the serial bus at at least one location of the frame indicates a format of the frame.

20 Claims, 3 Drawing Sheets

SERIAL BUS PROTOCOL

CROSS-REFERENCE TO RELATED APPLICATIONS

This application is a translation of and claims the priority benefit of European patent application number 21306804, filed on Dec. 16, 2021, entitled "Zero-Power Communication" and European Patent Application Number 22305752, filed on May 20, 2022, entitled "Data exchange on a serial bus," both of which applications are hereby incorporated by reference.

TECHNICAL FIELD

The present disclosure relates generally to electronics circuits or systems, and, more particularly to a serial bus protocol.

BACKGROUND

It is known to transmit or exchange data between two or more electronics devices of a communication system by using conductive wires connecting the devices the ones with each other.

However, known wired links for exchanging data between devices, for example the SPI or I2C buses, suffer from various drawbacks.

SUMMARY

One embodiment provides a system comprising: a serial bus having a data wire and a clock wire; a primary device connected to the bus and configured to provide a clock signal on the clock wire and to provide control bits on the serial bus; and one or a plurality of secondary devices each connected to the bus, wherein a format of each frame transmitted on the serial bus is determined by a number of control bits at at least one location of said frame.

One embodiment provides a method implemented in a system comprising: a serial bus having a data wire and a clock wire; a primary device connected to the bus and configured to provide a clock signal on the clock wire and to provide control bits on the serial bus; and one or a plurality of secondary devices each connected to the bus, wherein the method comprises, for each frame transmitted on the serial bus, the determination of the format of the frame by a number a control bits at at least one location of said frame.

According to one embodiment, a total number of bits of said frame is determined by the number of control bits at said at least one location of said frame.

According to one embodiment, each secondary device comprises a device address and one or a plurality of registers, each register having a register address, and wherein, for each frame transmitted between the primary device and a given secondary device, the transmitted frame comprises at least one word of data and indicates the device address of said given secondary device, the register address of a given register of said given secondary device and whether said at least one word of data is written into or read from said given secondary device.

According to one embodiment: when the transmitted frame comprises only one word of data, the word of data is write into or read from said given register of said secondary device; and when the transmitted frame comprises a plurality of words of data, a first word of said plurality of words of data is written into or read from said given register of said secondary device and the following words of said plurality of words of data are successively written into or read from registers of said secondary device having successive register addresses from the register address of said given register.

According to one embodiment, the number of control bits at the beginning of said transmitted frame determines whether the transmitted frame comprises a bit field explicitly indicating the register address of said given register or whether said bit field is omitted and the address of said given register is implicitly indicated by the frame.

According to one embodiment, the number of control bits at the beginning of said transmitted frame determines a number of bits of each word of data of the transmitted frame.

According to one embodiment, a number of control bits at a first location of the transmitted frame determines whether the transmitted frame comprises a first bit field explicitly indicating the register address of said given register, or whether the first bit field is omitted and the register address of said given register is implicitly indicated by the frame, and wherein, when the frame comprises the first bit field, the number of control bits at the first location further indicates a number of bits of the first bit field.

According to one embodiment, a number of control bits at a second location of the transmitted frame determines whether the transmitted frame comprises a second bit field explicitly indicating the device address of said secondary device, or whether the second bit field is omitted and the device address of said given secondary device is implicitly indicated by the frame, and wherein, when the frame comprises the second bit field, the number of control bits at the second location further indicates a number of bits of the second bit field.

According to one embodiment, a number of control bits at a first location of the transmitted frame determines: whether the transmitted frame comprises a first bit field explicitly indicating the register address of said given register and the at least one word of data comprises only one word of data; whether the first bit field is omitted, the register address of said given register being implicitly indicated by the frame, and the at least one word of data comprises exactly as much words of data than the number of registers of said second device; or whether the transmitted frame comprises a first bit field explicitly indicating the register address of said given register and the at least one word of data comprises a number of words of data superior or equal to two, said number of words of data being determined by the number of control bits at the first location.

According to one embodiment, said number of words of data is superior or equal to two, each of said words being written into or read from a corresponding register of successive registers of said second device, a first one of said successive registers having the register address indicated by the first bit field and the successive registers having successive register addresses.

According to one embodiment, a number of control bits at a second location of the transmitted frame determines a number of bits of each word of data of the transmitted frame.

According to one embodiment:
each of the primary device and the at least one secondary device comprises a first port connected to the clock wire and a second port connected to the data wire; the clock signal determines, for each bit transmitted on the serial bus, a succession of a first phase, a second phase, a third phase and a fourth phase; the primary device is configured to apply a reference potential on the data wire for the first phase of each transmission of a control bit from the primary device to a secondary device; the primary device is configured to apply the reference potential on the data wire or to leave its second port in a high impedance state, for the second, third and fourth phases of each transmission of a control bit from the primary device to a secondary device; and each secondary device is configured to leave its second port in a high impedance state for the first, second, third and fourth phases of each transmission of a control bit from the primary device to a secondary device.

According to one embodiment: the primary device is configured:
- to load its second port to a first potential different from the reference potential for the first phase of each transmission of a data bit between the primary device and a secondary device,
- to put its second port in a high impedance state for the second and fourth phase of each transmission of a data bit between the primary device and a secondary device, and
- to put its second port in a high impedance state for the third phase of each transmission of a data bit from a secondary device to the primary device; and each secondary device is configured:
- to put its second port in a high impedance state for the first, second and fourth phases of each transmission of a data bit between a secondary device and the primary device; and
- for the third phase of each transmission of a data bit from said secondary device to the primary device, to discharge its second port to the reference potential when the transmitted data bit has a first bit value, and to put its second port in a high impedance state when the transmitted data bit has a second bit value.

According to one embodiment, for the third phase of each transmission of a data bit from the primary device to a secondary device, each secondary device is configured to put its second port in a high impedance state, the primary device being configured to apply the reference potential on the data wire when the transmitted bit of data has a first bit value and to put its second port in a high impedance state when the transmitted bit of data has a second bit value.

According to one embodiment, each of the primary device and the at least one secondary device is configured to send an acknowledge bit by sending a data bit having the first value for a valid acknowledgement and the second value for an invalid acknowledgment.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In various embodiments, the system and method disclosed in co-pending U.S. patent application Ser. No. 18/063,453 entitled, "Serial Bus System and Method," as well as in European Patent Application No. 21306804, which may be used as a system in which to implement embodiment protocols disclosed herein.

Some embodiment of the present invention are directed to methods for exchanging, or transmitting, data on a serial bus and/or to data transmission via conductive wires connected between at least two electronics circuits or devices. Some embodiments provide reduced power consumption of data transmission on a serial bus.

Figure 1:
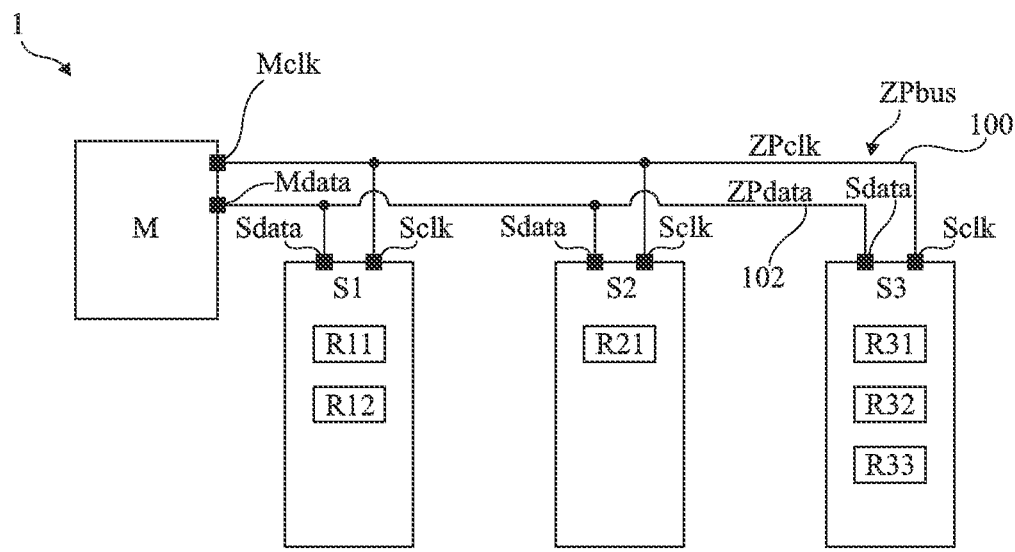
FIG. 1 illustrates with blocks an embodiment of a communication system of the type to which the described communication method applies.

FIG. 1 illustrates with blocks an embodiment of a communication system 1 of the type to which the described communication method applies.

The communication system 1 comprises a primary device M, also called master device M, and at least one secondary device S, also called slave device. In the example of FIG. 1, the system 1 comprises three secondary device S, respectively referenced S1, S2 and S3, although system 1 may comprise any number of secondary devices.

Each secondary device S2, S2, S3 comprises a port Sclk configured to be connected to a corresponding port Mclk of the primary device M. Each port Sclk is configured to receive a clock signal ZPclk. The primary device M thus comprises the port Mclk configured to be connected to the corresponding port Sclk of each secondary device S1, S2, S3. The port Mclk is configured to provide the signal ZPclk. The signal ZPclk cannot be provided by a secondary device S1, S2 or S3.

In FIG. 1, each port Sclk is connected to port Mclk by a conductive wire 100. Said otherwise, each port Sclk and Mclk is connected to the same wire 100. The wire 100 may be referred to as clock wire 100.

The wire 100 is part of a serial bus or, said otherwise, a bus for transmitting data in series (serial data). In the example of FIG. 1, the bus may be, for example, referred to as a Zero-Power bus or ZP bus.

Although not shown in FIG. 1, the capacitance equivalent to the capacitance of the wire 100 the capacitance of ports Sclk and the capacitance of port Mclk could be represented by a capacitive element connected between the wire 100 and a reference potential, preferably the ground potential GND. The value of this equivalent capacitance may be adjusted by connecting a capacitor between wire wo and the ground potential GND.

The signal ZPclk is a clock signal for synchronizing the transmission of each bit on the bus ZPbus.

For example, the signal ZPclk is a binary signal, that is to say a signal which commutes between two states or levels, and, more particularly, between a first level corresponding to the reference potential, in this example the potential GND, and a second level corresponding to a first potential Vdd different from the reference potential, the potential Vdd being, for example, positive with respect to the reference potential GND. For example, the positive potential Vdd has a value comprised in the range from 0.5 V to 5 V, for example equal to 1.5 V.

As the signal ZPclk is provided by the device M to the devices S1, S2 and S3, the power consumption of each device S1, S2, S3 is reduced compared to a communication system in which the clock signal for synchronizing a transmission of a bit would be at least partly provided by the device S1, S2 or S3.

In this example of embodiment, the signal ZPclk determines, for each transmission of a bit between the devices M and one of the devices S1, S2 and S3, four successive phases P1, P2, P3 and P4 of the bit transmission. Different examples of embodiment of how the signal ZPclk determines the four phases P1, P2, P3 and P4 will be described below, in relation with FIG. 6, FIG. 7 and FIG. 8.

Each of the devices S1, S2 and S3 comprises a port Sdata configured to be connected to a corresponding port Mdata of the primary device M. Thus, the primary device M comprises the port Mdata configured to be connected to the corresponding port Sdata of each secondary device S1, S2, S3. In FIG. 1, each port Sdata, Mdata is connected to a conductive wire 102. The wire 102 may be referred to as data wire 102. The signal on the wire 102 is called data signal and is referenced, or named, ZPdata. The wire 102 is part of the bus ZPbus.

Although not shown in FIG. 1, the capacitance equivalent to the capacitance of the wire 102, the capacitance of ports Sdata and the capacitance of port Mdata could be represented by a capacitive element connected between the wire 102 and the reference potential GND. The value of this equivalent capacitance may be adjusted by connecting a capacitor between wire 102 and the ground potential GND.

Although not shown on FIG. 1, each device M, S1, S2, S3 may have a supplementary port configured to receive the reference potential GND, the supplementary port of each device M, S1, S2, S3 being, for example, connected to a same conductive wire receiving the potential GND. This conductive wire at potential GND is, for example, part of the bus ZPbus.

The device M is configured to provide a control bit ctrl to the bus ZPbus. The control bit ctrl cannot be provided by a device S1, S2 or S3.

Further, each device M, S1, S2, S3 is configured to transmit or provide, via the bus ZPbus, a bit that is not a control bit. Such a bit which is transmitted between the device M and one of the devices S1, S2 and S3 and which is not a control bit ctrl is called bit of data, or data bit, in the following disclosure.

According to one embodiment, each device M, S1, S2, S3 is configured to provide an acknowledgement bit ack to the bus. An acknowledgment bit ack is, for example, a data bit having a first bit value if the acknowledgment is valid or granted and having a second bit value if the acknowledgment is not valid.

Each secondary device S1, S2, S3 is configured to put, or leave, its port Sdata in a high impedance state during the phases P1, P2 and P4 of each transmission of a bit between the device M and one of the devices S1, S2 and S3.

The system 1 allows for the transmission of a data bit from one secondary device S1, S2 or S3 to the primary device M.

To do that, the primary device M is configured to load its port Mdata, that is the wire 100, to the potential Vdd during the phase P1 of each transmission of a data bit from one devices S1, S2 and S3 to the device M, and to put, or leave, its port Mdata in a high impedance state for the phases P2, P3 and P4 of each transmission of a data bit from one devices S1, S2 and S3 to the device M. Further, each secondary device S1, S2, S3 is configured, during the phase P3 of each transmission of a bit of data from this device S1, S2 or S3 to the primary device M, to discharge its port Sdata, that is the wire 102, to the reference potential GND when the transmitted bit of data has a first value, for example '0', and to leave its port Sdata in a high impedance state when the transmitted bit of data has a second value, for example '1'. It has to be noted that, during the phase P3 of each transmission of a bit of data from a secondary device to the primary device M, the other secondary devices are configured to leave their ports Sdata in a high impedance state.

Said in other words, for each transmission of a bit of data from one secondary device S1, S2 or S3 to the primary device M: the wire 102 is loaded by the primary device M to the potential Vdd during the phase P1 of the bit transmission, while all the devices S1, S2 and S3 have their ports Sdata in a high impedance state; the wire 102 stays at a potential approximatively equal to the potential Vdd during the phase P2 of the bit transmission, because all the ports Mdata and Sdata connected to wire 102 are in a high impedance state; when the bit to transmit has the first value, the device S1, S2 or S3 which transmits (or emits) the bit puts, or pulls down, the wire 102 at the reference potential GND during the phase P3, by applying potential GND to its port Sdata, while the ports Sdata and Mdata of the other devices connected to the bus ZPbus are in a high impedance state; when the bit to transmit has the second value, during the phase P3, the device S1, S2 or S3 which transmits (or emits) the bit leaves the wire 102 at a potential approximatively equal to the potential Vdd, by leaving its port Sdata in a high impedance state, while the ports Sdata and Mdata of the other devices connected to the bus ZPbus are also in a high impedance state; and during the phase P4 of the bit transmission, all the devices M, S1, S2, S3 leave their ports Mdata and Sdata in a high impedance state, so that the potential on the wire 102 during this phase P4 stays equal to the reference potential if the transmitted bit has the first value, and to approximatively the potential Vdd if the transmitted bit has the second value.

For transmitting a bit to the primary device M, each secondary device S1, S2, S3 does not need to load the wire 102 to the potential Vdd. This allows the power consumption of each secondary device S1, S2, S3 to be reduced compared to a secondary device in which the transmission of a bit from the secondary device to a primary device would have required the secondary device to load the wire 102 to the potential Vdd.

According to one embodiment, during a transmission of a bit of data from one secondary device S1, S2 or S3 to the primary device M, the value of the transmitted bit is read by the device M during the phase P4 of this bit transmission. The reading of the value of the transmitted bit is based on the potential of the wire 102, that is to say the potential on port Mdata, during the phase P4, for example at the beginning of this phase P4. For example, the primary device M compares the potential of wire 102 (or port Mdata) to at least one potential (or threshold), and determines if the potential of wire 102 corresponds to the reference potential GND indicating that the transmitted bit has the first value, for example '0', or if the potential of the wire 102 corresponds to the potential Vdd indicating that the transmitted bit has the second value, for example '1'.

Based on the description above, those skilled in the art are capable of choosing or adapting the capacitance value of the wire 102 and/or the duration of each of the phases P1 to P4 to ensure that, when the transmitted bit of data has the second value (port Sdata in high impedance state during the corresponding phase P3), the potential on wire 102 during the corresponding phase P4, for example at the beginning of this phase P4, is approximatively equal to the potential Vdd.

Indeed, in practice, during the phases P2, P3 and P4 of the transmission, from one secondary device S1, S2 or S3 to the primary device M, of a bit of data having the second value, the potential on wire 102 decays with time, at a rate depending on the capacitance value of the wire 102 and possible current leakages through ports Sdata and Mdata.

Thus, in the present disclosure, the potential on wire 102 is said to be "approximatively equal to the potential Vdd", for example, if voltage on wire 102 is superior to a threshold indicating that voltage on wire 102 corresponds to a high level of the signal ZPdata, the voltage on wire 102 corresponding to a low level of the signal ZPdata, for example, when that voltage is inferior to the threshold.

The system 1 allows for the transmission of a data bit from the primary device M to one secondary device S1, S2 or S3. To do that, the phases P1, P2 and P4 of the transmission of a data bit from the primary device M to one of the secondary devices S1, S2 and S3 are identical to those of a transmission of a data bit from one of the secondary devices S1, S2 and S3 to the primary device M. However, during the phase P3 of the transmission of a data bit from the primary device M to one secondary device S1, S2 or S3, each secondary device S1, S2, S3 is configured to leave its port Sdata in a high impedance state and the primary device M is configured to put its port Mdata, and thus the wire 102, to the reference potential GND if the transmitted bit has the first value, and to leave its port Mdata, and thus the wire 102, in a high impedance state if the transmitted bit has the second value.

Said in other words, for each transmission of a data bit from the primary device M to one secondary device S1, S2 or S3: the wire 102 is loaded by the primary device M, and, more particularly, by port Mdata of the device M, to the potential Vdd during the phase P1 of the bit transmission, while the ports Sdata are all in a high impedance state; the wire 102 stays at a potential approximatively equal to the potential Vdd during the phase P2 of the bit transmission, because ports Mdata and Sdata are all in a high impedance state; when the bit to transmit has the first value, for the phase P3, device M puts, or pulls down, the wire 102 at the reference potential GND by applying potential GND to its port Mdata while ports Sdata of devices S1, S2 and S3 are all in a high impedance state; when the bit to transmit has the second value, for the phase P3, device M leaves the wire 102 at a potential approximatively equal to potential Vdd, by leaving its port Mdata in a high impedance state while the ports Sdata of devices S1, S2 and S3 are all in a high impedance state; and during the phase P4 of the bit transmission, all the devices M, S1, S2, S3 leave their ports Mdata and Sdata in a high impedance state, so that the potential on the wire 102 during this phase P4 stays equal to the reference potential if the transmitted bit has the first value, and to approximatively the potential Vdd if the transmitted bit has the second value.

According to one embodiment, during a transmission of a bit of data from the primary device M to a secondary device S1, S2 or S3, the value of the transmitted bit is read by this secondary device during the phase P4 of this bit transmission. During the phase P4, for example at the beginning of this phase P4, the reading of the value of the transmitted bit is based on the potential of the wire 102, that is to say the potential on port Sdata of the device S1, S2, S3 which is reading the bit value. For example, the secondary device compares the potential of wire 102 to at least one potential (or threshold), and determine if the potential of wire 102 corresponds to the reference potential GND indicating that the transmitted bit has the first value, for example '0', or if the potential of the wire 102 corresponds to the potential Vdd indicating that the transmitted bit has the second value, for example '1'.

The system 1 allows for the transmission of a bit of control ctrl from the primary device M to the secondary devices S1, S2, S3.

To do that, each device S1, S2, S3 is configured to leave its port Sdata at the high impedance state during all of the phases P1 to P4 of each transmission of the control bit ctrl from the device M to one device S1, S2 or S3. Further, the device M is configured to apply the reference potential GND on its port Mdata during the phase P1 of the transmission of the control bit ctrl. As an example, during the phase P2, P3 and P4 of the transmission of the control bit ctrl, the device M is configured to apply the reference potential GND on its port Mdata or to leave the port Mdata in a high impedance state, resulting in wire 102 staying at the reference potential GND as the ports Sdata are all in the high impedance state. Thus, the potential on the wire 102 at the end of the phase P2 and the beginning of phase P3 is equal to the reference potential GND, whereas it is approximatively equal to Vdd at the end of the phase P2 and the beginning of phase P3 of the transmission of a bit of data. The control bit ctrl may be then detected by each secondary device S1, S2, S3, based on the potential on wire 102 at the beginning of phase P3. For example, each device S1, S2, S3 is configured to determine, at the beginning of the phase P3 of a bit transmission, whether the voltage on the wire 102 is approximatively equal to the potential Vdd or is equal to the potential GND, for example by comparing the voltage of wire 102 to at least one threshold, similarly to what has been described above for a transmission of a data bit.

Said in other words, for each transmission of a control bit ctrl from the device M to one of the device S1, S2 and S3: the wire 102 is put, or pulled down, at the reference potential GND during the phase P1 of the transmission of the bit ctrl because port Mdata is put to potential GND while ports Sdata are all in a high impedance state; and the wire 102 stays at the reference potential GND during the other phases P2, P3 and P4 of this transmission because all the ports Sdata are in a high impedance state and port Mdata is in high impedance state or is pulling down wire 102 to potential GND.

Each secondary devices S1, S2 and S3 is further configured to transmit an acknowledgment bit ack to the primary device M. The bit ack is a data bit having the first value for indicating a valid acknowledgment, or, said in other words, that the acknowledgment is granted, and the second value for indicating an invalid acknowledgement, or, said in other words, that the acknowledgment is denied. The transmission of a bit ack from a secondary device S1, S2, S3 to the primary device M when the bit ack has the first value, respectively the second value, is thus identical to the transmission of a data bit from a secondary device S1, S2, S3 to the primary device M when the data bit has the first value, respectively the second value. Said in other words, the acknowledgment is granted if the wire 102 is pulled down to the reference potential GND during phase P3, so that granting an acknowledgment requires an action from the secondary device S1, S2 or S3 that emits the valid acknowledgement. Thus, in case all the secondary devices S1, S2 and S3 just leaves their ports Sdata to a high impedance state, the acknowledgment is denied.

Similarly, the primary device M is configured to transmit a bit of acknowledgment ack to the secondary devices S1, S2 and S3. The bit ack is a data bit having the first value for indicating a valid acknowledgment, or, said in other words, that the acknowledgment is granted, and the second value for indicating an invalid acknowledgement, or, said in other words, that the acknowledgment is denied. The transmission of a bit ack from the device M to the secondary devices S1, S2 and S3 when the bit ack has the first value, respectively the second value, is thus identical to the transmission of a bit of data from the primary device M to the secondary devices S1, S2 and S3 when the data bit has the first value, respectively the second value. Said in other words, the acknowledgment is granted if the wire 102 is pulled down to the reference potential GND during phase P3, so that granting an acknowledgment requires an action from the primary device M. Thus, in case the primary device M just leaves its port Mdata to a high impedance state, the acknowledgment is denied.

In the system 1, there is no pull-up resistor coupling the wire 102 to a node at a potential, for example Vdd, corresponding to a high level of the signal on the wire 102. Said in other words, system 1 does not comprise any no pull-up resistor having a first terminal connected to a node at a potential, for example Vdd, corresponding to a high level of the signal on the wire 102, and a second terminal connected to the wire 102. Preferably, the same applies for the wire 100.

Each of the devices S1, S2 and S3 has a device address @S that allows for the identification of each device S1, S2, S3 among the devices S1, S2 and S3. For example, the respective devices S1, S2 and S3 have respective device addresses @S1, @S2 and @S3.

Each device S1, S2, S3 comprises at least one register from which data could be read by the device M and/or into which data could be written by the device M, using the bus ZPbus.

For example, in the example of FIG. 1, device S1 has two registers R11 and R12, device S2 has one register R21 and device S3 has three registers R31, R32 and R33.

Each register of each device S1, S2, S3 has an address @R for identifying the register among the other registers of the system 1, and, more particularly, among the other registers of the device S1, S2, S3 when this device comprises more than only one register.

In order to reduce the power consumption in the system, the inventors here propose to adapt the format of a frame transmitted on the bus ZPbus when the device M reads data from one register of one device S1, S2 or S3 or writes data into one register of one device S1, S2 or S3. Thus, for a given system 1, the format of each frame could be adapted depending on how many secondary devices are connected to the bus and/or on how many registers the device into which data are written or from which data are read comprises. In order to indicate to each secondary device connected to the bus what is the format of the current frame, the device M emit a given number of control bit ctrl at at least one location, or field, of the frame, this given number of emitted bits ctrl determining the format of current frame, or, said otherwise, being determined by the format of the current frame. Thus, for a plurality of frame transmitted on the bus ZPbus, at least two frames may have different formats.

By determining the format of each frame transmitted based on the number of bits ctrl at at least one location of the frame, the total number of bits of the frame, that is to say the bit length of the frame, can be reduced compared to a system where all the frame have the same fixed format.

Different examples of embodiments of how the format of a transmitted frame is determined by the number of control bits ctrl at at least one location of the frame will be now described in relation with FIG. 2, FIG. 3, FIG. 4 and FIG. 5.

According to one embodiment, each frame transmitted on the ZPbus, or, said otherwise, each frame transmitted between the device M and one of the devices S1, S2 and S3, comprises at least one word of data and indicates the device address of this device S1, S2 or S3, the register address of a given register of this device S1, S2 or S3, and whether the at least one word of data of the frame has to be written into or read from this device S1, S2 or S3, for example whether a word of data of the frame has to be written into or read from the register of this device having the register address indicated by the frame. It has to be noted that, in practice, when a frame is transmitted on the bus for the device M and one of the device S1, S2 and S3 to exchange the at least one word of data comprised in the frame, all the devices connected to the bus can see the frame. However, the device S1, S2 or S3 into which data are written or from which data are read is identified by the indication of the device address of this device comprised in the frame.

Figure 2:
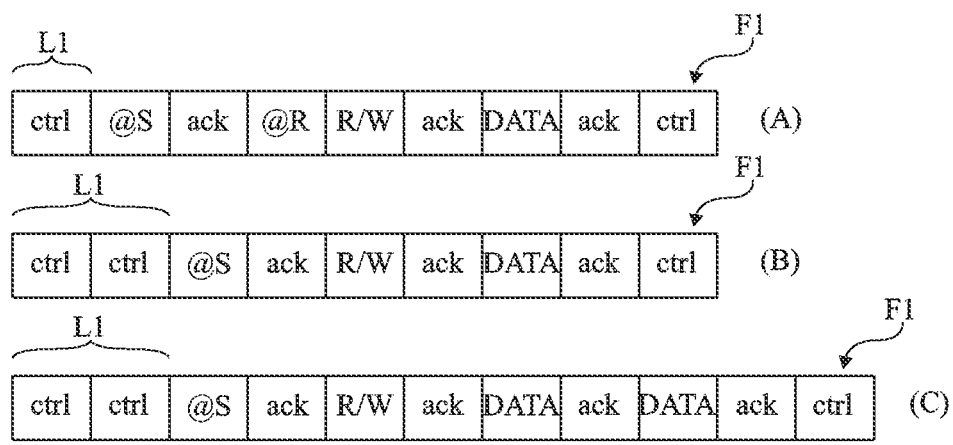
FIG. 2 illustrates, with three views A, B and C, an embodiment of frames of a communication in the system of the FIG. 1.

FIG. 2 illustrates, with three views A, B and C, an embodiment of frames F1 of a communication in the system 1 of the FIG. 1.

In this embodiment, a number of control bits ctrl at a first location L1 in the transmitted frame F1 determines whether the frame F1 comprises a field, and, more particularly, a field of bits (or bit field), @R explicitly indicating a register address of a register of a secondary device S1, S2 or S3, or whether this bit field @R is omitted and the register address is implicitly indicated by frame F1.

In the FIG. 2, view (A) shows the frame F1 when the number of control bits ctrl at the location L1 of the frame F1 indicates or determines that the frame F1 comprises the field @R explicitly indicating the register address of a register of a device S1, S2 or S3. In this example, the frame F1 comprises the field @R when the number of bits ctrl at location L1 of the frame F1 is equal to one. In this example, location L1 is at the beginning of the frame F1. In this example, location L1 is disposed before the field @R in the frame F1, such that the bit(s) ctrl at location L1 are sent on the bus before the field @R.

For example, the format of the frame F1 of view (A) is used when device M exchanges data with the device S1, having registers R11 and R12, or with device S2 having registers R31, R32 and R33, and when the frame F1 comprises only one word of data DATA to be exchanged between the devices M and S1, 0 between the devices M and S3. Indeed, it is then needed to explicitly indicate the register address of the register R11 or R12 of device S1, respectively of the register R31, R32 or R33 of the device S3, where this word DATA has to be written into or read from.

View (B) of FIG. 2 shows the frame F1 when the number of control bits ctrl at location L1 of the frame F1 indicates or determines that the field @R is omitted. In this example, the field @R is omitted when the number of bits ctrl at location L1 of the frame F1 is equal to two.

For example, the format of the frame F1 of view (B) is used when device M exchanges data with the device S2 that has only one register R21, and when the frame F1 comprises only one word of data DATA to be exchanged between the devices M and S2. Indeed, it is then unnecessarily to explicitly indicate the register address of register R21, as the word DATA is necessarily written into or read from this register R21. Thus, even if field @R is omitted, the address of the register R21 is implicitly indicated by the frame F1.

In views (A) and (B), frame F1 comprises only one word DATA which has to be written into or read from a register having the register address indicated by frame F1, either explicitly with the field @R (view (A)) or implicitly (view (B)).

View (C) of FIG. 2 illustrates the frame F1 when the number of control bits ctrl at location L1 of the frame F1 indicates or determines that the field @R is omitted, in a case where the frame F1 comprises a number of words of data DATA which is strictly superior to one and equal to the number of registers in the device S1 or S3 in which the words DATA has to be written into or read from. In this case, each word DATA is written into or read from a corresponding register of this device S1 or S3 and there is no need to explicitly indicate the register address of each register. More particularly, in this case, the words DATA are successively read from or written into respective registers of this device S1 or S3, the registers of this device S1 or S3 having successive register addresses, the first word DATA of the frame F1 being read from or written into the register having the first register address among the successive register addresses. Said in other words, a first word of the words DATA of the frame F1 is written into or read from the first register of the registers having successive register addresses, this first register having the register address implicitly indicated by frame F1, and the following words DATA of the frame F1 are successively written into or read from the registers having successive register addresses from the one of the first register.

For example, in view (C), frame F1 comprises two words DATA and thus corresponds to a frame transmitted between device M and the device S1 which comprises two registers R11 and R12, the first word DATA of the frame F1 (on the left on FIG. 2) being read from or written into the register for example R11, and the following word DATA of the frame F1 (on the right on FIG. 2) being read from or written into the register R12.

The format of the frame F1 of the view (C) allows to send a plurality of words DATA in a single frame, thus avoiding to send a frame having the format of view (A) for each word DATA of this plurality of words DATA. This results in the reduction of the number of bits transmitted on the bus and, thus, in reducing the power consumption.

In the embodiment of FIG. 2, each frame F1 further indicates a device address of one of the devices S1, S2 and S3. This address is explicitly indicated by a corresponding bit field @S. In the example of FIG. 2, the field @S is disposed after the location L1.

Further, in the example of FIG. 2, the field @S is followed by a first acknowledgment bit ack. This first bit ack is sent by the device S1, S2 or S3 corresponding to the device address indicated by field @S in order to indicate to the device M its connection to the bus.

In the example of FIG. 2, the first bit ack is followed by the field @R when the number of bits ctrl at location L1 indicates that the frame F1 does comprise the field @R, or this field @R is omitted when the number of bits ctrl at location L1 indicates that the field @R is omitted.

In the example of FIG. 2, the first bit ack when field @R is omitted, or the field @R when not omitted, is followed by a field R/W, for example corresponding to one data bit, indicating whether each word DATA of the frame F1 should be read from or write into the device S1, S2 or S3 having the device address indicated by field @S. The field R/W is, in this example, followed by a second acknowledgement bit ack.

In the example of FIG. 2, the second bit ack is followed by the only word DATA or the plurality of words DATA the frame F1 comprises, each word DATA being for example followed by a corresponding acknowledgement bit ack.

Optionally, a control bit ctrl is located, or disposed, at the end of each frame F1, in order to indicate that the frame F1 is finished.

In the present disclosure, the bits of a frame are transmitted on the bus ZPbus from the left to the right in the representation of FIG. 2, FIG. 3, FIG. 4 and FIG. 5. Said otherwise, each bit of each frame is transmitted on the bus ZPbus before all the bits of the frame which are on its right on the Figures.

Figure 3:
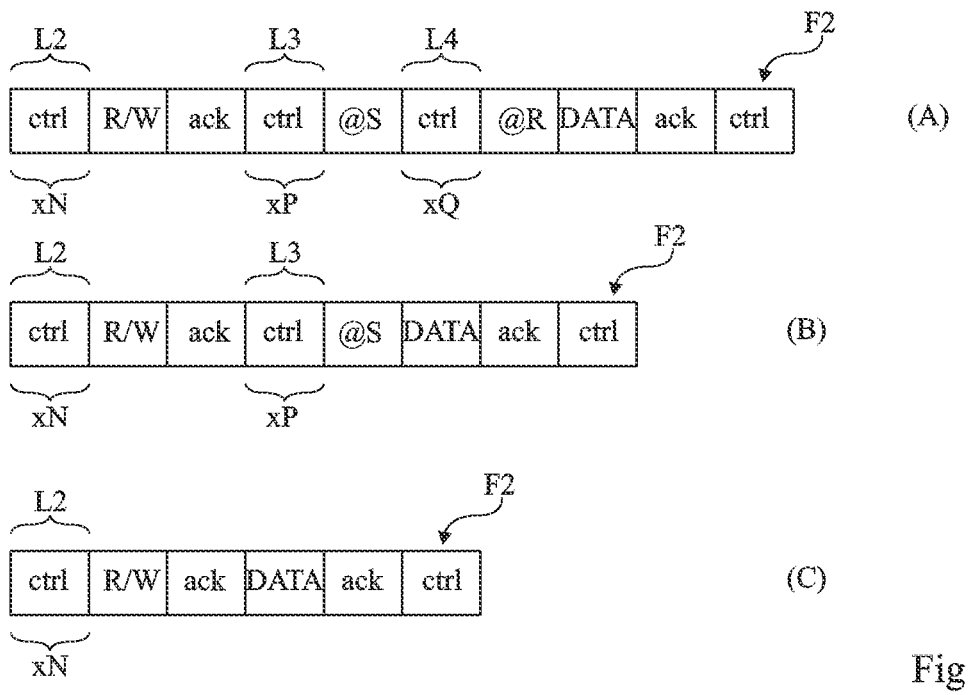
FIG. 3 illustrates, with three views A, B and C, another embodiment of frames of a communication in the system of the FIG. 1.

FIG. 3 illustrates, with three views A, B and C, an embodiment of frames F2 of a communication in the system 1 of the FIG. 1.

In this embodiment, a number N of control bits ctrl at a first location, or field, L2 in the transmitted frame F2 determines the size or length, that is the total number of bits, of a word DATA transmitted by the frame F2. Said otherwise, the frame F2 comprises only one word DATA having a size determined by the number N of bits ctrl at the location L2 of the frame. The number of bits ctrl at the location L2 is preferably superior or equal to one when the location L2 corresponds to the beginning of frame F2. Preferably, location L2 is disposed before the word DATA.

For example, the word DATA of frame F2 comprises 8, 12, 16, 32 and 64 bits when N is equal to 1, 2, 3, 4 and 5 respectively.

In this embodiment, the format of the frame F2 is also determined by a number P of control bits ctrl at a second location, or field, L3 in the transmitted frame F2. More particularly, the number P of bits ctrl at location L3 determines the size or length, that is the total number of bits, of a bit field @S comprising or corresponding to a device address of a device S1, S2 or S3 where the word DATA is read from or written into. Preferably, location L3 is disposed before the field @S.

In particular, when P is null, that is there is no control bit ctrl at location L3, field @S has a null length and comprises no bit, or, said otherwise, the field @S is omitted. When field @S is omitted, the device address of the secondary device where the word DATA is read from or written into is implicitly indicated by the frame F2. For example, the field @S is omitted when the system 1 comprises only one secondary device S1, S2 or S3 connected to the bus ZPbus.

For example, the field @S comprises 0 (field @S omitted), 8, 12, 16, 32 and 64 bits when P is equal to 0, 1, 2, 3, 4 and 5 respectively.

In this embodiment, the format of the frame F2 is further determined by a number Q of control bits ctrl at a third location, or field, L4 in the transmitted frame F2. More particularly, the number Q of bits ctrl at location L4 determines the size or length, that is the total number of bits, of a bit field @R comprising or corresponding to a register address of a device S1, S2 or S3 where the word DATA is read from or written into. Preferably, location L4 is disposed before the field @R.

In particular, when Q is null, that is there is no control bit ctrl at location L4, field @R has a null length and comprises no bit, or, said otherwise, the field @R is omitted. When field @R is omitted, the register address of the register where the word DATA is read from or written into is implicitly indicated by the frame F2. For example, the field @R is omitted when the word DATA is written into or read from a register of a secondary device that comprises only this register.

For example, the field @R comprises 0 (field @R omitted), 8, 12, 16, 32 and 64 bits when Q is equal to 0, 1, 2, 3, 4, 5 respectively.

The frame F2 of view (A) corresponds to a case where P is not null and Q is not null. Thus, the frame F2 comprises both fields @S and @R, each with a non-null length.

For example, the format of the frame F2 of the view (A) is used in a system 1 comprising at least two secondary devices, when the word DATA of frame F2 is written into or read from one of a plurality of registers of the secondary device corresponding to field @S, the register where the word DATA is written into or read from having the register address indicated by the field @R. For example, frame F2 of view (A) is used for when the word DATA is written into or read from the register R11 of device S1 of the system 1 of FIG. 1.

The frame F2 of view (B) corresponds to a case where P is not null and Q is null. Thus, the frame F2 comprises the field @S with a non-null length but field @R is omitted.

For example, the format of the frame F2 of the view (B) is used in a system 1 comprising at least two secondary devices, when the word DATA of frame F2 is written into or read from the only register of the secondary device corresponding to field @S. For example, frame F2 of view (B) is used for when the word DATA is written into or read from the register R21 of device S2 of the system 1 of FIG. 1.

The frame F2 of view (C) corresponds to a case where both P and Q are null. Thus, both fields @S and @R are omitted.

For example, the format of the frame F2 of the view (C) is used in a system 1 comprising only the secondary device S2, which has only one register R21. Thus, the word DATA of frame F2 is necessarily written into or read from this device S2, and, more particularly, from the only one register R21 of this device S2.

In the embodiment of FIG. 3, each frame F2 further comprises a field R/W, for example corresponding to one data bit, indicating whether the word DATA of the frame F2 should be read from or write into the register of the secondary device S1, S2 or S3 having the device address indicated (implicitly or explicitly) by the frame, this register having the register address indicated (implicitly or explicitly) by the frame F2. The field R/W is disposed after the N bits ctrl at the location L2, or, said otherwise, after location L2. The field R/W is, in this example, followed by a first acknowledgement bit ack.

Further, in the example of FIG. 3, the first acknowledgment bit ack is followed by the P bits ctrl at the location L3, knowing that there may have no bit ctrl (at location L3 when P is null. Said otherwise, the first bit ack is followed by the location L3. The P bits ctrl at the location L3 are followed by the field @S, knowing that this field @S may be omitted when P is null.

In the example of FIG. 3, the field @S when P is not null, or the first bit ack when P is null, is followed by the Q bits ctrl at the location L4, or, said otherwise, by the location L4. The Q bits ctrl at the location L4 are followed by the field @R, knowing that this field @R may be omitted when Q is null.

In the example of FIG. 3, the field @R (when Q is no-null) or the field @S (when P is non-null and Q is null) or the first bit ack (when P and Q are null) is followed by the word DATA. The word DATA is, for example, followed by a second acknowledgement bit ack.

Optionally, a control bit ctrl is located, or disposed, at the end of each frame F2, in order to indicate that the frame F1 is finished.

In the embodiment described in relation with FIG. 3, the format of the frame F2 is determined by the number N of bits ctrl at the location L2, by the number P of bits ctrl at the location L3 and by the number Q of bits ctrl at the location L4. More particularly, in the embodiment described in relation with FIG. 3, the size of the word DATA is determined by the number N of bits ctrl at the location L2, the size of the field @S is determined by the number P of bits ctrl at the location L3 and the size of the field @R is determined by the number Q of bits ctrl at the location L4.

Figure 4:
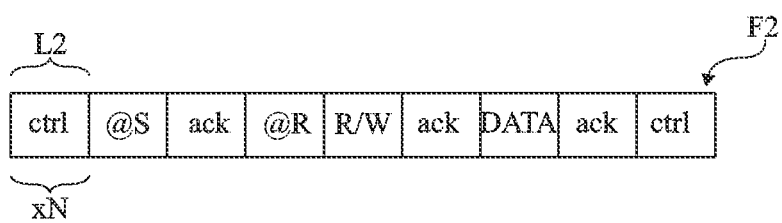
FIG. 4 illustrates yet another embodiment of a frame of a communication in the system of the FIG. 1.

In a first other embodiment illustrated by FIG. 4, the format of the frame F2 is determined by the number N of bits ctrl at the location L2 only. More particularly, in this first embodiment the size of the word DATA is determined by the number N of bits ctrl at the location L2, the size of the field @S is fixed and non-null and the size of the field @R is fixed and non-null. In this first other embodiment, there is no location L3 and L4 in the frame.

In a second other embodiment not illustrated, the format of the frame F2 is determined by the number P of bits ctrl at the location L3 only. More particularly, in this second embodiment the size of the word DATA is fixed, the size of the field @S is determined by the number P of bits ctrl at the location L3 and the size of the field @R is fixed and non-null. In this second other embodiment, there is no location L4 and no location L2 in the frame, although a single bit ctrl is preferably disposed at the beginning of the frame to indicate the beginning of the frame.

In a third other embodiment not illustrated, the format of the frame F2 is determined by the number Q of bits ctrl at the location L4 only. More particularly, in this third embodiment the size of the word DATA is fixed, the size of the field @S is fixed and non-null and the size of the field @R is determined by the number Q of bits ctrl at the location L4. In this third other embodiment, there is no location L3 and no location L2 in the frame; although a single bit ctrl is preferably disposed at the beginning of the frame to indicate the beginning of the frame.

The combination of the first, second and third embodiments corresponds to the embodiment illustrated by FIG. 3.

Further, the first, second and third embodiments are combinable by combining with each other two embodiments among these first, second and third embodiments.

For example, the combination of the first and second embodiments corresponds to an embodiment where the format of the frame F2 is determined by the number N of bits ctrl at the location L2 and by the number P of bits ctrl at the location L3. More particularly, in this second embodiment the size of the word DATA is determined by the number N of bits ctrl at the location L2, the size of the field @S is determined by the number P of bits ctrl at the location L3 and the size of the field @R is fixed and non-null. Based on this example, those skilled in the art are capable of implementing any combination of two embodiments among the first, second and third embodiments described above.

Further, in each of the first, second and third embodiments described above and in all the combinations of these first, second and third embodiments described above, the frame F2 may comprises more than only one word of data DATA. In this case, similarly to what has been described in relation with view (C) of FIG. 2, the words DATA are successively read from or written into respective registers having successive register addresses in the device S1 or S3 corresponding to the device address indicated by the frame, the first word DATA of the frame being read from or written into the register having the first register address among these successive register addresses. Said in other words, a first word of the words DATA of the frame F2 is written into or read from the first register of the registers having successive register addresses, that is the register having the register address implicitly (no field @R–Q is null) or explicitly (field @R having a non-null length) indicated by frame F2, and the following words DATA of the frame F2 are successively written into or read from the registers having successive register addresses from the one of this first register.

Figure 5:
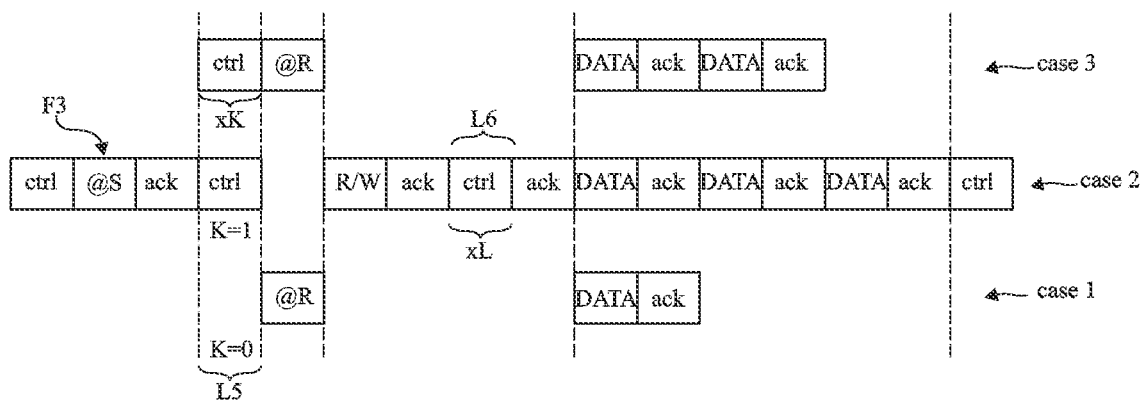
FIG. 5 illustrates yet another embodiment of a frame of a communication in the system of the FIG. 1.

FIG. 5 illustrates an embodiment of frames F3 of a communication in the system 1 of the FIG. 1.

In this embodiment, a number K of control bits ctrl at a first location L5 of the transmitted frame F3 determines or indicates whether the frame F3 comprises a bit field @R explicitly indicating the register address of a register (case 1—bottom of FIG. 5); whether the field @R is omitted (case 2—middle of FIG. 5); or whether the frame F3 comprises the field @R explicitly indicating the register address of a register (case 3—top of FIG. 5). The location L5 of the K bits ctrl is disposed before the field @R when the frame F3 does comprise the field F3.

In case 1, the number K further indicates that frame F3 comprises exactly one word of data DATA. This word DATA is written into or read from the register having the address explicitly indicated by field @R.

In case 2, the number K further indicates that frame F3 comprises as much words DATA as there are registers in the device S1, S2 or S3 where the words DATA are written into or read from. This case 2 is similar to what has been described in relation with view (C) of FIG. 2. Thus, in this case, each word DATA is written into or read from a corresponding register of the device S1, S2 or S3 having the device address indicated by frame F3 and there is no need to explicitly indicate the register address of each register. More particularly, in this case, the words DATA are successively read from or written into respective registers of this device S1, S2 or S3, the registers of this device S1, S2 or S3 having successive register addresses, the first word DATA of the frame F3 being read from or written into the register having the first register address among the successive register addresses. Said in other words, a first word of the words DATA of the frame F3 is written into or read from the first register of the registers having successive register addresses, this first register having the register address implicitly indicated by frame F3, and the following words DATA of the frame F3 are successively written into or read from the registers having successive register addresses from the one of the first register.

In case 3, the number K further indicates that frame F3 comprises more than only one word DATA, for example K words DATA. In this case, each word DATA is written into or read from a corresponding register of the device S1, S2 or S3 having the device address indicated by frame F3, the registers where the words DATA are written into or read from having successive addresses from the register address indicated by field @R, the first word DATA being written into or read from the register having the register address indicated by field @R, and the following words DATA being written into or read from the registers having successive addresses following the register address of the address indicated by field @R. Said in other words, each of the words DATA of frame F3 is written into or read from a corresponding register of a plurality of successive registers of the device S1, S2 or S3 having the device address indicated by frame F3, a first one of these successive registers having the register address indicated by the field @R and these successive registers having successive register addresses. In case 3, the device where words DATA are written into or read from for example comprises a total number of registers which is at least equal to the number of words DATA of the frame F3, preferably strictly superior to the number of words DATA of the frame F3.

For example, K is null in case 1, or, said otherwise, there is no bit ctrl at location L4 in case 1, K is equal to one in case 2, and K is equal to the number of words DATA of the frame F3 in case 3.

For example, the format of the frame F3 in case 1 is used when only one word DATA is written into or read from a secondary device having a plurality of registers. It is then needed to know the register of the plurality of registers where the word DATA is written in or read from, by explicitly indicating the register address of this register with the filed @R.

For example, the format of frame F3 of case 2 represented in FIG. 5 comprises three words DATA and is used when one word DATA is written in or read from each register R31, R32 and R33 of device S3 of FIG. 1. For example, the first word DATA of the frame F3 (on the left on FIG. 5) is read from or written into the register R31, the second word DATA of the frame F3 (on the middle on FIG. 5) is read from or written into the register R32 and the third word DATA of frame F3 (on the right on FIG. 5) is read from or written in the register R33.

For example, the format of frame F3 of case 3 represented in FIG. 5 comprises two words DATA and is used when two words DATA are written in or read from two corresponding registers of a secondary device comprising more than two registers. For example, the format of the frame F3 represented in FIG. 5 is used when a first word DATA is written into or read from a first register of the device S3 of FIG. 1 and a second word DATA is written into or read from a second register of the device S3. For example, when the registers R31, R32 and R33 have successive register addresses, and when the field @R corresponds to the address of register R31, the first word DATA is written into or read from the register R31, and the second word DATA is written into or read from the register R32 having a register address following the register address of register R31.

As shown on FIG. 5, the frame F3 may further comprises a location L6 in case the format of frame F3 is further determined by a number L of bits ctrl at the location L6. More particularly, the number L of bit ctrl determines the size or length of each word DATA of the frame F3. For example, each word DATA comprises exactly 8, 12, 16, 32 and 64 data bits when L is respectively equal to 1, 2, 3, 4 and 5. The location L6 of the L bits ctrl is disposed before the word(s) DATA of the frame F3.

In the example of FIG. 5, a bit ctrl is located at the beginning of the frame F3 to indicate the beginning of the frame F3.

In the example of FIG. 5, the bit ctrl at the beginning of frame F3 is followed by a field @S explicitly indicating the device address of the secondary device where the word(s) DATA of the frame F3 are written into or read from. In this example, the field @S has a fixed length.

In the example of FIG. 5, the field @S is followed by a first acknowledgement bit ack.

In the example of FIG. 5, the first bit ack is followed by the K bits ctrl at the location L5, or, said otherwise, is followed by the location L5. In this example, the K bits ctrl of the location L5 are followed by the filed @R when K is different from one. In this example, field @R has a fixed length.

In the example of FIG. 5, a field R/W, corresponding for example to a single data bit, indicates whether the word(s) DATA of frame F3 are written into or read from the secondary device having the device address indicated by the field @S. In this example, the field R/W follows the field @R when K is different from one, and the bit ctrl at location L5 when K is equal to one.

In the example of FIG. 5, field R/W is followed by a second acknowledgment bit ack.

In the example of FIG. 5, the second bit ack is followed by the L bits ctrl at location L6, which are followed by a third acknowledgment bit ack.

In the example of FIG. 5, the third bit ack is followed by the word(s) DATA of the frame F3, and each word DATA is, for example, followed by a corresponding acknowledgment bit ack.

Optionally, a bit ctrl is located at the end of the frame F3 indicates that the frame F3 is finished.

In the embodiments described in relation with the FIGS. 2, 3, 4 and 5, those skilled in the art are capable of modifying the positions in the corresponding frames of the locations L1, L2, L3, L4 and/or L5, the field @R, the field @S and/or the field R/W, knowing that, when the number of bits ctrl at a given location of the frame determines the size and/or the presence of a corresponding field, this given location is before the corresponding field in the frame, and that the word(s) DATA and their corresponding acknowledgment bits ack are disposed at the end of the frame, before the optional bit ctrl at the very end of the frame.

Further, those skilled in the art will be capable of combining certain feature of the embodiments described above.

For example, in the embodiment of FIG. 5, those skilled in the art are capable of adding, after the bit ctrl at the beginning of the frame F3, and before the field @S, an acknowledgment bit followed by P bits ctrl determining the size of the field @S and/or whether this field @S is omitted, similarly to what has been described for the location L3 of the FIG. 3.

In the present disclosure, the registers which have been described are all registers where a word DATA can be written into or read from with the bus, or, said otherwise, registers which are accessible by bus. However, it is obvious that each secondary device may comprise at least one further register where a word DATA cannot be written into or read from with the bus, or, said otherwise, at least one further register which is not accessible by bus which.

Figure 6:
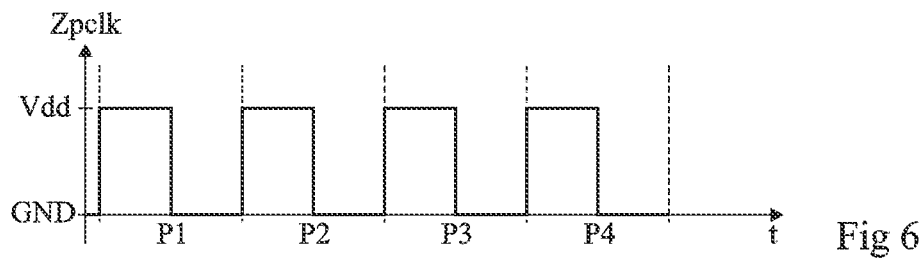
FIG. 6 is a chronogram illustrating an embodiment of a synchronization of a bit transmission in the system of FIG. 1.
Figure 7:
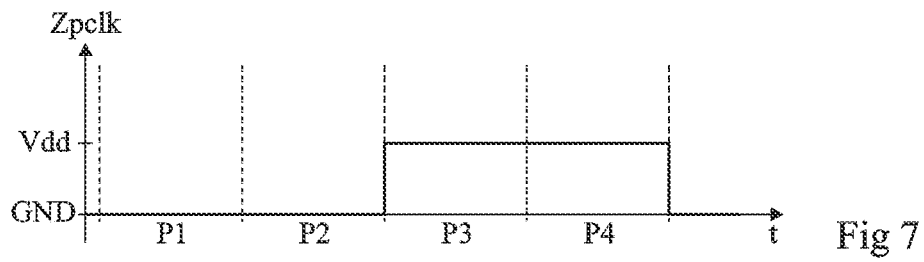
FIG. 7 is a chronogram illustrating another embodiment of a synchronization of a bit transmission in the system of FIG. 1.
Figure 8:
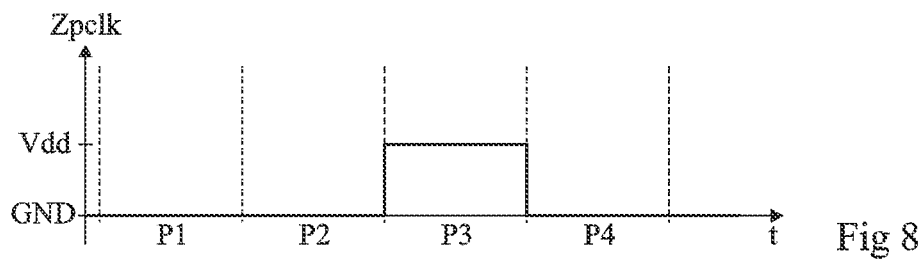
FIG. 8 is a chronogram illustrating yet another embodiment of a synchronization of a bit transmission in the system of FIG. 1.

FIG. 6, FIG. 7 and FIG. 8 each illustrates an embodiment of a synchronization of a bit transmission in the system of FIG. 1. More particularly, FIG. 6, FIG. 7 and FIG. 8 each shows the evolution of the signal ZPclk on the wire 100 and the corresponding succession of the phases P1, P2, P3 and P4.

In the embodiment of FIG. 6, each phase P1, P2, P3 and P4 corresponds to a respective cycle, or period, of the signal ZPclk. Thus, in FIG. 6, a bit transmission takes four periods of the signal ZPclk. In the example of FIG. 6, each period of the signal ZPclk begins by an active edge of the signal ZPclk, to know a rising edge in the example of FIG. 6. Thus, each phase P1, P2, P3, P4 of the transmission begins in synchronization with an active edge of the signal ZPclk.

In the embodiments of FIGS. 7 and 8, each transmission of a bit between devices S1, S2, S3 and M is performed in only one cycle or period of the signal ZPclk. Said in other words, in these embodiments, each transmission of a bit corresponds to only one pulse of the signal ZPclk.

More particularly, in FIGS. 7 and 8, the beginning of the phase P3 of the bit transmission, or, said in other words, the switching from the phase P2 to the phase P3 of this transmission, corresponds to the beginning of the pulse of the signal ZPclk. The beginning of the pulse of the signal ZPclk correspond to an active edge of the signal ZPclk, to know a rising edge in the examples of FIGS. 7 and 8.

In the embodiment of FIG. 7, the end of the phase P4 of the bit transmission corresponds to the end of the pulse of the signal ZPclk. The end of the pulse of the signal ZPclk corresponds to an inactive edge of the signal ZPclk, to know a falling edge in the example of FIG. 7. For example, in such an embodiment, the value of the potential of the signal ZPdata is read at the end of the phase P4 for determining the value of a data bit.

In the embodiment of FIG. 8, the end of the phase P3 of the bit transmission, or, said in other words, the switching from the phase P3 to the phase P4 of this transmission, corresponds to the end of the pulse of the signal ZPclk. The end of the pulse of the signal ZPclk corresponds to an inactive edge of the signal ZPclk, to know a falling edge in the example of FIG. 8. For example, in such an embodiment, the value of the potential of the signal ZPdata is read at the beginning of the phase P4 for determining the value of a data bit.

According to one embodiment, in the case of FIG. 8, the duration of the pulse of the signal ZPclk, or, said in other words, the duration of the phase P3, is determined by the time required by each device S1, S2, S3 and M to discharge the wire 102 from the potential Vdd to the potential GND. More particularly, the duration of the pulse ZPclk is determined by the discharging time of the wire 102 by these devices, so that each device S1, S2, S3, M is capable of fully discharging the wire 102 during the phase P3.

As the embodiments of FIGS. 7 and 8 require less pulses of the signal ZPclk to implement a transmission of a bit between the devices S1, S2, S3 and M than the embodiment of FIG. 6, the power consumption of the system 1, and in particular of the primary device M, is less in the embodiments of FIGS. 7 and 8 than in the embodiment of FIG. 6.

Figure 9:
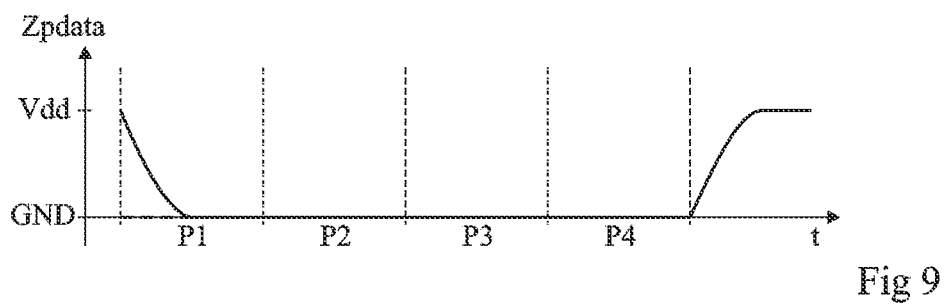
FIG. 9 is a chronogram illustrating an embodiment of a control bit in the system of FIG. 1.

FIG. 9 is a chronogram illustrating an embodiment of a transmission of a bit ctrl in the system of FIG. 1. More particularly, FIG. 9 shows the evolution of the signal ZPdata on the wire 102 during the successive phases P1, P2, P3 and P4 of the transmission of the bit ctrl from the primary device M to the secondary devices S1, S2 and S3.

During the phase P1, the primary device M applies the reference potential to its port Mdata while ports Sdata are in a high impedance state, to discharge the wire 102 to potential GND. As illustrated by dotted lines in FIG. 9, at the beginning of the phase P1, the potential of the wire 102 may already be the reference potential GND.

During the next phase P2, potential GND is applied to the port Mdata or the port Mdata is left in high impedance state. Thus, potential of the wire 102 stays equal to the reference potential GND.

For example, at the beginning of the phase P3, the secondary devices S1, S2 and S3 detect that the potential of the wire 102 corresponds to the potential GND, meaning that the transmitted bit is the bit ctrl.

During the next phase P3, potential GND is applied to the port Mdata or the port M2data is left in high impedance state. Thus, potential of the wire 102 stays equal to the reference potential GND.

During the next phase P4, potential GND is applied to the port Mdata or the port Mdata is left in high impedance state. Thus, potential of the wire 102 stays equal to the reference potential GND.

Figure 10:
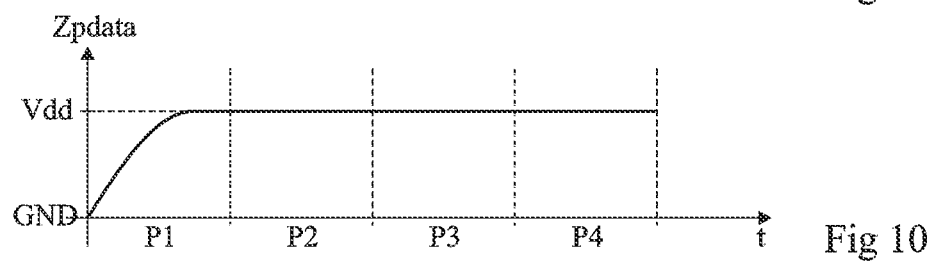
FIG. 10 is a chronogram illustrating an embodiment of a transmission of a bit having a first value in the system of FIG. 1.

FIG. 10 is a chronogram illustrating an embodiment of a transmission of a data bit having the second value in the communication system of FIG. 1. More particularly, FIG. 10 shows the evolution of the signal ZPdata on the wire 102 during the successive phases P1, P2, P3 and P4 of the transmission of a data bit between a secondary device and the primary device M, in the case where the transmitted bit has the second value.

During the phase P1, the primary device M loads the wire 102 to potential Vdd by applying potential Vdd on port Mdata while ports Sdata are in a high impedance state. As illustrated by dotted lines in FIG. 10, at the beginning of the phase P1, the potential of the wire 102 may already be approximatively equal to potential Vdd because of a previous bit transmission.

During the next phase P2, the wire 102 is left in a high state impedance as all ports Sdata and Mdata are in a high impedance state. Thus, potential of the wire 102 stays approximatively equal to the potential Vdd.

For example, at the beginning of the phase P3, each secondary device detects that the potential of the wire 102 corresponds to the potential Vdd, meaning that the transmitted bit is not a bit ctrl.

During phase P3 of FIG. 10, as the transmitted bit has the second value, all the ports Sdata and Mdata are left in a high impedance state. Thus, the potential of the wire 102 stays approximatively equal to the potential Vdd.

During the next phase P4 of FIG. 10, the potential of the wire 102 stays approximatively equal to the potential Vdd as all ports Sdata and Mdata are in a high impedance state, indicating to the device M, S1, S2 or S3 which receives the data bit that this data bit has the second value.

Figure 11:
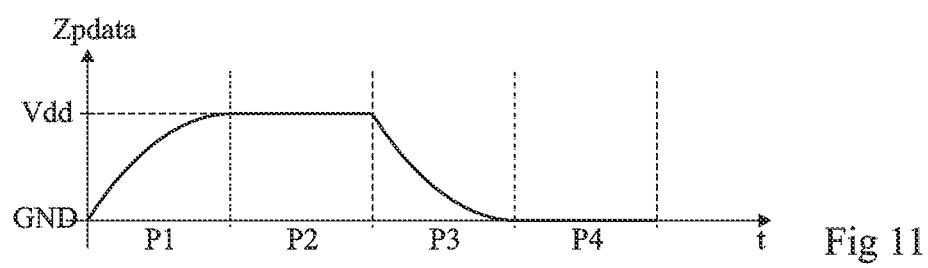
FIG. 11 is a chronogram illustrating an embodiment of a transmission of a bit having a second value in the system of FIG. 1.

FIG. 11 is a chronogram illustrating an embodiment of a transmission of a data bit having the first value in the communication system of FIG. 1. More particularly, FIG. 11 shows the evolution of the signal ZPdata on the wire 102 during the successive phases P1, P2, P3 and P4 of the transmission of a data bit between a secondary device and the primary device M, in the case where the transmitted bit has the first value.

Only the differences between FIGS. 3 and 4 are here discussed. In particular, FIG. 4 differs from FIG. 3 only by its phases P3 and P4.

During the next phase P3, as the transmitted bit has the first value, the potential GND is applied to wire 102, by the port Sdata of a secondary device when the data bit is read from this secondary device by the primary device, or by the port Mdata of the primary device M when the data bit is written in a secondary device by the device M. Thus, the wire 102 is discharged to the potential GND.

During the next phase P4, the potential of the wire 102 stays equal to the potential GND as all port Sdata and Mdata are in a high impedance state, indicating to the device M, S1, S2 or S3 which receives the data bit that this data bit has the first value.

As previously indicated, the acknowledgement bit ack is a data bit having the first value if the acknowledgment is granted, and the second value if the acknowledgment is denied.

Although in the examples given above in relation with the FIGS. 1 to 11 the first value, respectively the second value, of a data bit corresponds to the binary value '0', respectively the binary value '1', the contrary is also possible.

Although in the examples above given above in relation with the FIGS. 1 to 11 the potential Vdd is positive with respect to the reference potential GND, in other examples, the potential Vdd could be negative with respect to the reference potential.

Although in the examples given above in relation with the FIG. 10 and the FIG. 11 the active edges of the clock signal ZPclk are the rising edges, the contrary is also possible. However, having active edges of signal ZPclk that correspond to falling edge will result in more consumption as the device M will have to maintain the wire 100 at the potential Vdd when the ZPclk presents no pulse.

As an example of application of the system 1 described above, each device S1, S2, S3 is a device comprising one or a plurality of sensors each associated with at least one corresponding register of the device which is accessible by the bus in order to read the data provided by the sensor and/or to write configuration parameters of the sensor. In this case, the consumption of the secondary devices for receiving or emitting data is very low, which allows the devices to be powered by a battery, for example when the secondary devices are IoTs (Internet of Things) devices.

Preferably, in all the of above described embodiments, a bit transmitted on the bus is either a data bit, which could be for example a bit ack, or a control bit ctrl. Said otherwise, in some embodiments, there are only two types of bit transmitted on the bus: a bit of the first type being a control bit, and a bit of the second type being a data bit.

Various embodiments and variants have been described. Those skilled in the art will understand that certain features of these embodiments can be combined.

Further other variants will readily occur to those skilled in the art. For example, although the bus of the system 1 is a Zero Power bus and the devices S1, S2, S3 and M of the system 1 are then configured to transmit bits data and ctrl as described above, the described embodiments of the format of a frame transmitted on the bus applies to any communication system in which: the system comprises a serial bus having a clock wire and at least one data wire; the system comprises a primary device connected to the bus and configured to provide a clock signal on the clock wire and to provide control bits on the serial bus; the system comprises one or a plurality of secondary devices each connected to the bus; the primary device and the secondary devices are each configured to transmit data bits which are different from the control bit; and the secondary devices are not able to provides a bit ctrl to the bus. For example, the described embodiments of the frame described above may be implemented in a communication system where the bus is an I2C-type bus or an SPI-type bus. For example, the present disclosure may be applied to an I2C but by replacing each control bit described above, except for the control bit located at the very end of the frames, by the a start condition or a restart condition, and by replacing the control bit located at the very end of the frames by a stop condition.

Finally, the practical implementation of the embodiments and variants described herein is within the capabilities of those skilled in the art based on the functional description provided hereinabove. In particular, in all the above described embodiments, as the number of bit ctrl at at least one location of a frame determines the format of the frame, and as the bits ctrl are provided to the bus only by the primary device, this is the primary device which determines the format of each of the frames transmitted on the bus. For example, the primary device stores information indicating the number of secondary devices connected to the bus and/or the number of registers in each secondary device and/or the size of the field @R and/or @S the addressed secondary device is waiting for and/or the size of the word DATA the addressed secondary device is waiting for, etc., so that the primary device adapted the format of each frame based on these information.

What is claimed is:

1. A system comprising:
   a primary device configured to be connected to at least one secondary device via serial bus having a data wire and a clock wire, the primary device configured to:
   provide a clock signal on the clock wire; and
   transmit a frame comprising control bits on the serial bus, wherein a quantity of control bits transmitted on the serial bus at at least one location of the frame indicates a format of the frame.

2. The system of claim 1, wherein a total number of bits of the frame is indicated by the quantity of control bits at the at least one location the said frame.

3. The system of claim 1, wherein:
   the at least one secondary device comprises a device address and one or a plurality of registers;
   each register of the plurality of registers has a respective register address; and
   the frame comprises at least one word of data, indicates a device address of a given secondary device of the at least one secondary device, indicates the respective register address of a given register of the given secondary device, and indicates whether the at least one word of data is written into or read from the given secondary device.

4. The system of claim 3, wherein:
   when the frame comprises only one word of data, the word of data is written into or read from the given register of the given secondary device; and
   when the frame comprises a plurality of words of data, a first word of said plurality of words of data is written into or read from the given register of the given secondary device and following words of said plurality of words of data are successively written into or read from registers of said secondary device having successive register addresses from the register address of said given register.

5. The system of claim 3, wherein:
   the at least one location of the frame is a beginning of the frame; and
   the quantity of control bits indicates whether the frame comprises a bit field explicitly indicating the register address of said given register or whether the bit field is omitted and the address of the given register is implicitly indicated by the frame.

6. The system of claim 3, wherein:
   the at least one location of the frame is a beginning of the frame; and
   the quantity of control bits indicates a number of bits of each word of data of the frame.

7. The system of claim 3, wherein:
   the at least one location of the frame is a first location of the frame;
   the quantity of control bits at the first location of the frame indicates whether the frame comprises a first bit field explicitly indicating the register address of said given register, or whether the first bit field is omitted and the register address of the given register is implicitly indicated by the frame; and
   when the frame comprises the first bit field, the quantity of control bits at the first location further indicates a number of bits of the first bit field.

8. The system of claim 3, wherein:
   the at least one location of the frame is a first location of the frame;
   the quantity of control bits at the first location of the frame indicates whether the frame comprises a second bit field explicitly indicating the device address of the secondary device, or whether the second bit field is omitted and the device address of the given secondary device is implicitly indicated by the frame; and
   when the frame comprises the second bit field, the quantity of control bits at the first location further indicates a number of bits of the second bit field.

9. The system of claim 3, wherein:
   the at least one location of the frame is a first location of the frame;
   the quantity of control bits at the first location of the frame indicates one of:
   whether the frame comprises a first bit field explicitly indicating the register address of the given register and the at least one word of data comprises only one word of data;
   whether the first bit field is omitted, the register address of said given register is implicitly indicated by the frame, and the at least one word of data comprises exactly as many words of data as a number of registers of a second device; or
   whether the frame comprises a first bit field explicitly indicating the register address of said given register and the at least one word of data comprises a number of words of data greater than or equal to two, and the number of words of data are indicated by the quantity of control bits at the first location.

10. The system of claim 9, wherein:
the number of words of data is greater than or equal to two;
each of the words are configured to be written into or read from a corresponding register of successive registers of the second device; and
a first register of the successive registers has its register address indicated by the first bit field and the successive registers have successive register addresses.

11. The system of claim 9, wherein:
the at least one location of the frame further comprises a second location; and
the quantity of control bits at the second location of the frame indicates a number of bits of each word of data of the frame.

12. A system comprising:
a serial bus having a data wire and a clock wire;
a primary device comprising a first port coupled to the clock wire and a second port coupled to the data wire, wherein the primary device is configured to provide a clock signal on the clock wire and configured to provide control bits to the serial bus; and
a secondary device comprising a first port coupled to the clock wire and a second port coupled to the data wire, wherein
the primary device is configured to transmit a frame comprising the control bits on the serial bus, wherein a number of control bits transmitted on the serial bus at at least one location of the frame indicates a format of the frame,
the clock signal determines, for each bit transmitted on the serial bus, a succession of a first phase, a second phase, a third phase and a fourth phase,
the primary device is configured to apply a reference potential on the data wire for the first phase of each transmission of a control bit from the primary device to the secondary device,
the secondary device is configured to leave its second port in a high impedance state for the first, second, third and fourth phases of each transmission of a control bit from the primary device to the secondary device.

13. The system of claim 12, wherein:
the primary device is configured:
to load its second port to a first potential different from the reference potential for the first phase of each transmission of a data bit between the primary device and the secondary device,
to put its second port in the high impedance state for the second and fourth phase of each transmission of the data bit between the primary device and the secondary device, and
to put its second port in the high impedance state for the third phase of each transmission of a data bit from the secondary device to the primary device; and
the secondary device is configured:
to put its second port in the high impedance state for the first, second and fourth phases of each transmission of the data bit between the secondary device and the primary device, and
for the third phase of each transmission of the data bit from the secondary device to the primary device, to discharge its second port to the reference potential when the transmitted data bit has a first bit value, and to put its second port in the high impedance state when the transmitted data bit has a second bit value.

14. The system of claim 13, wherein:
for the third phase of each transmission of a data bit from the primary device to the secondary device, the secondary device is configured to put its second port in the high impedance state; and
the primary device is configured to apply the reference potential on the data wire when the transmitted data bit has the first bit value and to place its second port in the high impedance state when the transmitted data bit has the second bit value.

15. The system of claim 13, wherein each of the primary device and the secondary device is configured to send an acknowledge bit by sending a bit having the first bit value for a valid acknowledgement and the second bit value for an invalid acknowledgment.

16. A method of operating a primary device coupled to be connected to at least one secondary device via serial bus having a data wire and a clock wire, the method comprising:
provide a clock signal on the clock wire; and
transmitting a frame comprising control bits on the serial bus, wherein a quantity of control bits transmitted on the serial bus at at least one location of the frame indicates a format of the frame.

17. The method of claim 16, wherein:
the at least one secondary device comprises a device address and one or a plurality of registers;
each register of the plurality of registers has a respective register address; and
the frame comprises at least one word of data, indicates a device address of a given secondary device of the at least one secondary device, indicates the respective register address of a given register of the given secondary device, and indicates whether the at least one word of data is written into or read from the given secondary device.

18. The method of claim 17, wherein:
the at least one location of the frame is a beginning of the frame; and
the quantity of control bits indicates whether the frame comprises a bit field explicitly indicating the register address of said given register or whether the bit field is omitted and the address of the given register is implicitly indicated by the frame.

19. The method of claim 17, wherein:
the at least one location of the frame is a beginning of the frame; and
the quantity of control bits indicates a number of bits of each word of data of the frame.

20. The method of claim 17, wherein:
the at least one location of the frame is a first location of the frame;
the quantity of control bits at the first location of the frame indicates one of:
whether the frame comprises a first bit field explicitly indicating the register address of the given register and the at least one word of data comprises only one word of data;
whether the first bit field is omitted, the register address of said given register is implicitly indicated by the frame, and the at least one word of data comprises exactly as many words of data as a number of registers of a second device; or
whether the frame comprises a first bit field explicitly indicating the register address of said given register and the at least one word of data comprises a number of words of data greater than or equal to two, and the number of words of data are indicated by the number of control bits at the first location.

\* \* \* \* \*